US 6,734,475 B2

(12) United States Patent
Myono et al.

(10) Patent No.: US 6,734,475 B2
(45) Date of Patent: May 11, 2004

(54) CHARGE PUMP DEVICE

(75) Inventors: Takao Myono, Saitama (JP); Akira Uemoto, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/067,701

(22) Filed: Feb. 5, 2002

(65) Prior Publication Data
US 2002/0105021 A1 Aug. 8, 2002

(30) Foreign Application Priority Data
Feb. 6, 2001 (JP) ........................................ 2001-030096

(51) Int. Cl.[7] .................... H01L 27/148; H01L 29/768
(52) U.S. Cl. ........................ 257/215; 257/216; 257/235; 257/241
(58) Field of Search .................... 257/215, 251

(56) References Cited

U.S. PATENT DOCUMENTS 5,537,075 A * 7/1996 Miyazaki .................... 327/566
5,757,043 A * 5/1998 Saito et al. .................. 257/299
5,777,317 A * 7/1998 Maki ........................ 250/208.1
5,892,267 A * 4/1999 Takada ....................... 327/536
6,111,294 A * 8/2000 Strenz ........................ 257/351
6,285,240 B1 * 9/2001 Shiau et al. ................ 327/536

FOREIGN PATENT DOCUMENTS
KR                367316            3/1998

OTHER PUBLICATIONS

US 5,612,921, 3/1997, Chang et al. (withdrawn)
"On–Chip High–Voltage Generation in MNOS Integrated Circuits Using an Improved Voltage Multiplier Technique", John F. Dickson, pp. 374–378.

* cited by examiner

Primary Examiner—Jerome Jackson
Assistant Examiner—Jesse A. Fenty
(74) Attorney, Agent, or Firm—Fish & Richardson P.C.

(57) ABSTRACT

P type well regions 31 and 32 are formed in N type well regions 21 and 22 respectively. The N type well regions 21 and 22 are formed separately each other. Charge transfer MOS transistors M2 and M3 are formed in the P type well regions 31 and 32 respectively. Thus, parasitic thyristor causing latch-up is nor formed.

11 Claims, 4 Drawing Sheets

CHARGE PUMP DEVICE

BACKGROUND OF THE INVENTION

1. Field of the Invention

The present invention relates to a charge pump semiconductor device of large current output used for a power source circuit, etc., particularly to the charge pump semiconductor device enabling to operate stably by preventing occurrence of pseudo latch-up.

2. Description of the Related Art

Recent picture instruments such as video camera, digital still camera (DSC), DSC phone, etc. use CCD (Charge Coupled Devices) to take in the picture. A CCD driving circuit for driving the CCD needs a power source circuit of high voltage (in or around a range of 10 to 20 V) of positive and negative and large current (several mA). Nowadays, the high voltage is generated using a switching regulator.

The switching regulator can generate high voltage with high performance, that is, high power efficiency (output power/input power). However, the circuit has a demerit generating harmonic noise at switching of current so as to use shielding the power source circuit. Further needs a coil as external parts.

Then, Dickson charge pump device is noticed as the above-mentioned power source circuit for portable equipment. The circuit is described in detail in technical literature: John F. Dickson "On-chip High-Voltage Generation in MNOS Integrated Circuits Using an Improved Voltage Multiplier Technique" IEEE JOURNAL OF SOLID-STATE CIRCUITS, VOL. SC-11, NO. 3 pp. 374–378 JUNE 1976.

A circuit diagram of four stages Dickson charge pump device is shown in FIG. 5. Diodes D1 to D5 are connected in series. Symbols C to C4 are coupling capacitors connected to connected points of each of the diodes D1 to D5, symbol CL is an output capacitor, and symbols CLK and CLKB are input clock pulses being opposite phase each other. Symbol 51 is a clock driver receiving CLK and CLKB, and symbol 52 is a current load. Power source voltage Vdd is supplied to the clock driver 51. Thus, output amplitude of clock pulses $\phi 1$ and $\phi 2$ output from the clock driver 51 becomes almost Vdd. The clock pulse $\phi 1$ is supplied to the capacitors C2 and C4, and the clock pulse $\phi 2$ is supplied to the capacitors C1 and C3.

In the stable state, when constant current Iout flows through output, input current to the charge pump device is current from input voltage Vin and current supplied from the clock driver. These currents are the followings, if ignoring charge/discharge current to stray capacitor. Average current of 2Iout flows to arrow direction of a solid line while $\phi 1$=High and $\phi 2$=Low.

Average current of 2Iout flows to arrow direction of a dotted line while $\phi 1$=Low and $\phi 2$=High. These average currents at clock cycle become Iout all. Boosted voltage Vout of the charge pump device at stable state is expressed as the following:

$$V_{out}=V_{in}-V_d+n(V_{\phi'}-V_I-V_d) \quad (1)$$

Here, $V_{\phi'}$ is voltage amplitude generated by coupling capacitor caused by change of the clock pulse. VI is voltage fall generated by output current Iout, and Vin is input voltage, it is usually power source voltage Vdd in positive boosting and 0 V in negative boosting. $V_d$ is forward bias diode voltage, and n is numbers of stages of pumping. Further, $V_I$ and $V_{\phi'}$ are expressed as the followings:

$$V_I=I_{out}/f(C+C_s)=(2I_{out}T/2)/(C+C_s) \quad (2)$$

$$V_{\phi'}=V_{\phi}C/(C+C_s) \quad (3)$$

Here, C1 to C4 are clock-coupling capacitors, $C_s$ is stray capacitor at each node, $V_{\phi}$ is clock pulse amplitude, f is frequency of clock pulse, and T is clock period. Power efficiency of the charge pump is expressed by the following equation, placing Vin=Vdd, and neglecting charge/discharge current flowing to the stray capacitor from the clock driver.

$$\eta=V_{out}I_{out}/(n+1)V_{dd}I_{out}=V_{out}/(n+1)V_{dd} \quad (4)$$

Thus, in the charge pump device, boosting is carried out by transferring electric charge to the next stage one after another using diodes as a charge transfer device. However, considering attaching to semiconductor integrated circuit device, using MOS transistor is realized easier than diode of PN junction in view of the adaptation to the process.

Then, use of MOS transistor is proposed instead of diode for the charge transfer device. In this case, threshold voltage Vth of MOS transistor displaces Vd in the equation (1).

However, enough examination has not been carried out about device construction for assembling the charge pump device in the semiconductor integrated circuit device and realizing large current and stable operation in the present circumstances. Particularly, in charge pump device of large output current, there is a problem that latch-up appears at starting operation, however the mechanism has not been made clear.

SUMMARY OF THE INVENTION

The invention is carried out in view of the above-mentioned conventional technical problem, an object thereof is to realize a charge pump device of large current and high efficiency. Further another object is to prevent occurrence of latch-up not avoiding with the conventional charge pump device of large current and to realize stable operation.

The charge pump device of the invention provides: plurality of well regions formed on a substrate separately each other; plurality of charge transfer transistors formed individually in each of said well regions and connected in series each other; and capacitors coupled to each connecting point of these charge transfer transistors, wherein drain layer of said charge transfer transistor and said well region in which the charge transfer transistor is formed are connected electrically.

According to the characteristic constitution of the invention, the well regions in which the charge transfer transistors are formed are separated each other, and drain layer of the charge transfer transistor and well region in which the charge transfer transistor is formed are connected electrically. That is, since relation "voltage between gate and substrate Vgb=voltage between gate and drain Vgd" is held, increase of threshold voltage Vth of the charge transfer transistor by back gate bias effect is prevented. Thus, since ON resistance of the charge transfer transistor decreases, a charge pump device of large output current can be realized.

Further, in order to realize the above-mentioned characteristic constitution connecting electrically the drain layer of the charge transfer transistor and the well region in which the charge transfer transistor is formed, high concentration diffusion layer being same conductivity type as the well region is formed in the well region, and the diffusion layer and said drain layer are connected. Thus, since the drain layer of the charge transfer transistor and the well region in which the charge transfer transistor is formed are connected electrically with low resistance, increase of threshold voltage Vth of the charge transfer transistor by back gate bias effect is surely prevented.

Although the charge pump device of large output current can be realized by the above way according to the characteristic constitution of the invention, there is a problem that latch-up generates easily at operation starting. Then another characteristic constitution of the invention separates electrically said well regions in which said charge transfer transistors are formed so that parasitic thyristor construction causing pseudo latch-up is not formed.

The concrete characteristic constitution is that drain layer of said charge transfer transistor and said first conductive type well region in which the charge transfer transistor is formed are connected electrically, each first conductive type well region in which said charge transfer transistor is formed is included by a second conductive type well region, and the adjacent said second conductive type well regions are separated.

That is, each charge transfer transistor is formed in double well regions (first conductive type well region and second well region), and parasitic thyristor construction is not formed by separating said adjacent second conductive type well regions in distance.

DESCRIPTION OF THE PREFERRED EMBODIMENTS

Figure 1:
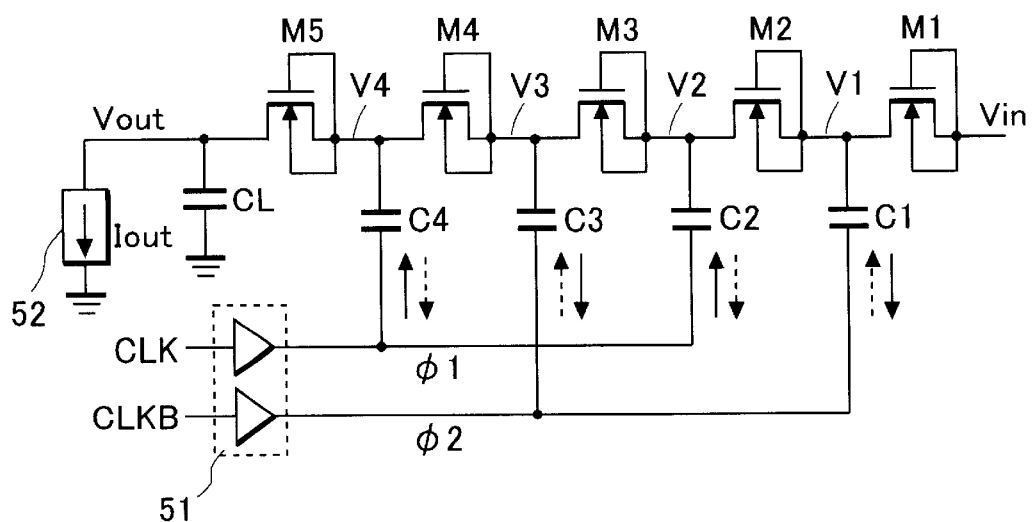
FIG. 1 is a circuit diagram of a charge pump device according to an embodiment of the invention.
Figure 5:
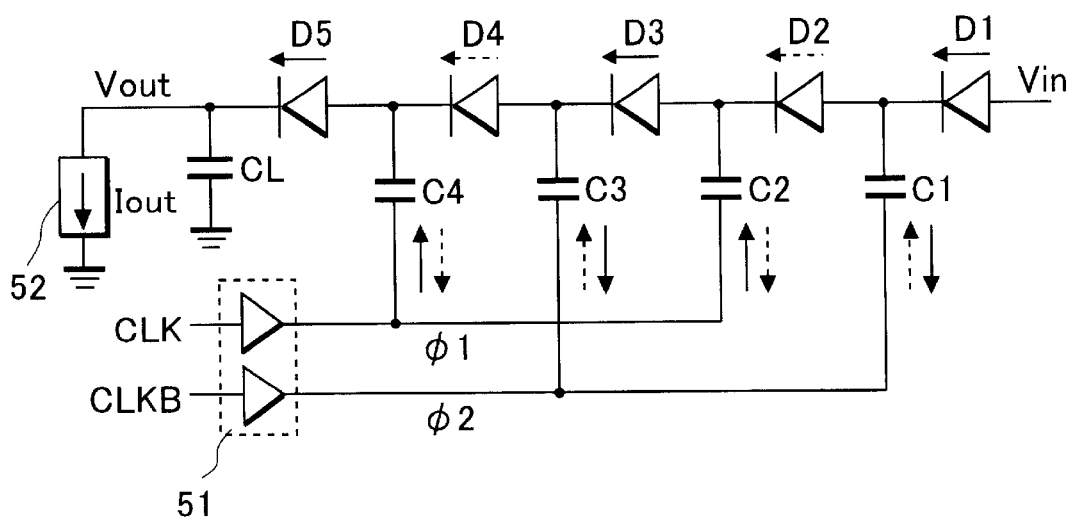
FIG. 5 is a circuit diagram showing a Dickson charge pump device of four stages.

Equivalent circuit diagram of a charge pump device according to an embodiment of the invention is shown in FIG. 1. In the charge pump circuit device, considering adaptability to semiconductor process, MOS transistors M1 to M5 are used instead of diodes as a charge transfer device. That is, as gates and drains of the charge transfer MOS transistors M1 to M5 are connected, the transistors function as diodes. Another constitution is similar as the charge pump device shown in FIG. 5.

Each drain and substrate of the charge transfer MOS transistors M1 to M5 are connected. That is, since the following relation holds:

voltage between gate and substrate Vgb=voltage between gate and drain Vgd, increase of threshold voltage Vth of charge transfer transistor caused by back gate bias effect is prevented. The above-mentioned constitution is necessary for realizing the charge pump device of large current.

Figure 2:
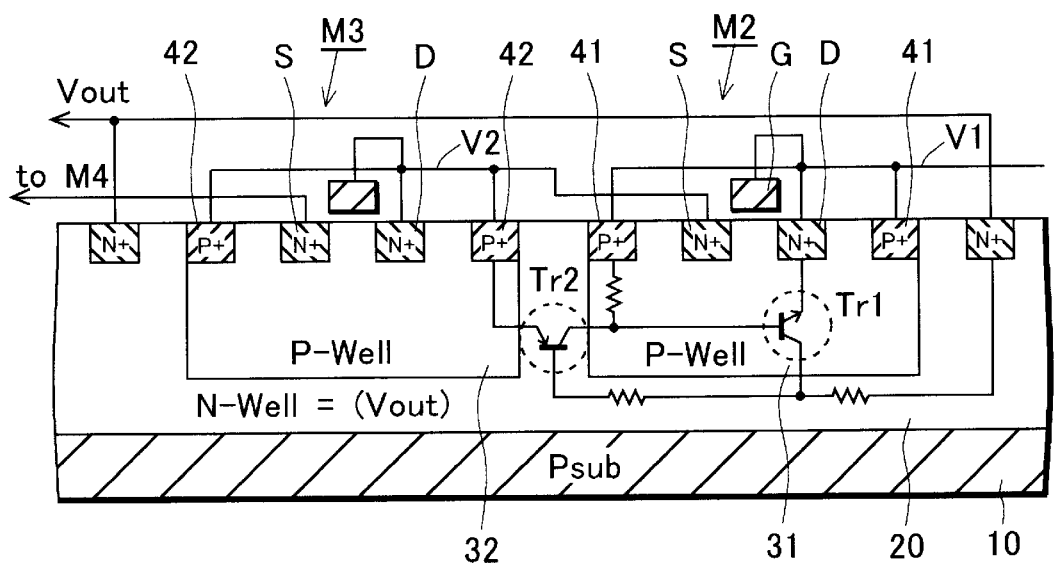
FIG. 2 is a sectional construction view of the charge pump device according to the embodiment of the invention.

In order to further decrease ON resistance of the charge transfer MOS transistors M1 to M5, it is effective that voltage between gate and source Vgs is made higher than power source voltage Vdd of the clock driver, for example. A sectional construction view of the charge pump device according to the embodiment of the invention is shown in FIG. 2. The sectional structure corresponds to the sectional structure of the charge transfer MOS transistors M2 and M3 shown in FIG. 1. N well region 20 is formed on surface of a P type semiconductor substrate (P type silicon substrate for example) 10, and separated P type well regions 31 and 32 are formed in the N well region 20. In the P type well region 31, the charge transfer MOS transistors M2 is formed. In the P type well region 32, the charge transfer MOS transistor M3 is formed.

The charge transfer MOS transistor M2 formed in the P type well region 31 will be described further in detail. Drain layer D and source layer S of N+ type are formed on surface of the P type well region 31. In the P type well region 31, P+ layer 41 having higher concentration than the P type well region 31 is formed. In order to decrease contact resistance with the P type well region 31, it is desirable that the P+ layer 41 is arranged in belt shape so as to surround the P type well region 31 at plane view. The drain layer D and the P+ layer 41 are connected electrically by Al wiring and the like.

Since the drain layer D of the charge transfer transistor M2 and the P well region 31 where the charge transfer transistor M2 is formed are connected electrically with low resistance, increase of threshold voltage Vth of the charge transfer transistor M2 caused by back gate bias effect is surely prevented. The charge transfer MOS transistor M3 formed in the P type well region is similarly constituted. The charge transfer MOS transistors M1, M4, and M5 not shown are similarly constituted.

The N type well region 20 is formed so that the N type well region 20 and the P type well regions 31 and 32 are biased to backward direction at steady state by supplying boosted output voltage Vout of the charge pump device to the N type well region 20 through the N+ layer.

However, it became clear that phenomenon such as latch-up appears and output voltage Vout is seldom boosted when plurality of P type well regions 31, 32, etc. are formed in single N type well region 20 as described above. The generating mechanism presumed by the inventor is the following.

First, a parasitic thyristor is formed between adjacent P type well regions 31 and 32. That is, a vertical type NPN transistor Tr1 and a lateral type PNP transistor Tr2 are formed in FIG. 2. Here emitter of the vertical type NPN transistor Tr1 is drain layer D of the charge transfer MOS transistor M2, base thereof is the P type well region 31, and collector thereof is the N type well region 20.

Emitter of the lateral type PNP transistor Tr2 is P+ layer 42 formed in P type well region 32, base thereof is the N type well region 20 between the P type well regions 31 and 32, and collector thereof is the P type well region 31. These parasitic NPN transistor Tr1 and parasitic PNP transistor Tr2 constitute a parasitic thyristor.

At stable operation of the above-mentioned charge pump device of FIG. 1, the following relation holds:

Output voltage Vout>V3>V2>V1>input voltage Vin where input voltage Vin is usually Vdd (equal to power source voltage of the clock driver), V3 is source voltage of the charge transfer MOS transistor M3, V2 is source voltage of the charge transfer MOS transistor M2, and V1 is source voltage of the charge transfer MOS transistor M1.

However, at start of the charge pump device (start of boosting operation), relation of "V1>V2>V3>Vout" holds. That is, capacitors C1, C2, C3, and C4 are charged in order from the first stage.

As the result, current flows between base and emitter of the parasitic PNP transistor Tr2 when "V1−Vout>Vbi". Here, Vbi is ON voltage between base and emitter.

Since collector current of the parasitic PNP transistor Tr2 becomes base current of the parasitic NPN transistor Tr1, the parasitic NPN transistor Tr1 is made ON because of the current so as to conduct between emitter and collector. Then, the parasitic NPN transistor Tr1 lets current between base and emitter of the parasitic PNP transistor Tr2 flow, and lets current flow to voltage V1 even from output voltage Vout side.

As the result, output voltage Vout does not increase. Since the above-mentioned cooperative operation of the parasitic NPN transistor Tr1 and the parasitic PNP transistor Tr2 is similar with latch-up, it is hereafter referred to as pseudo latch-up. However, since it is considered that the operation of the parasitic NPN transistor Tr1 and the parasitic PNP transistor Tr2 stops when power source is made OFF one made ON again, the operation is considered that it is different from general latch-up.

Figure 3:
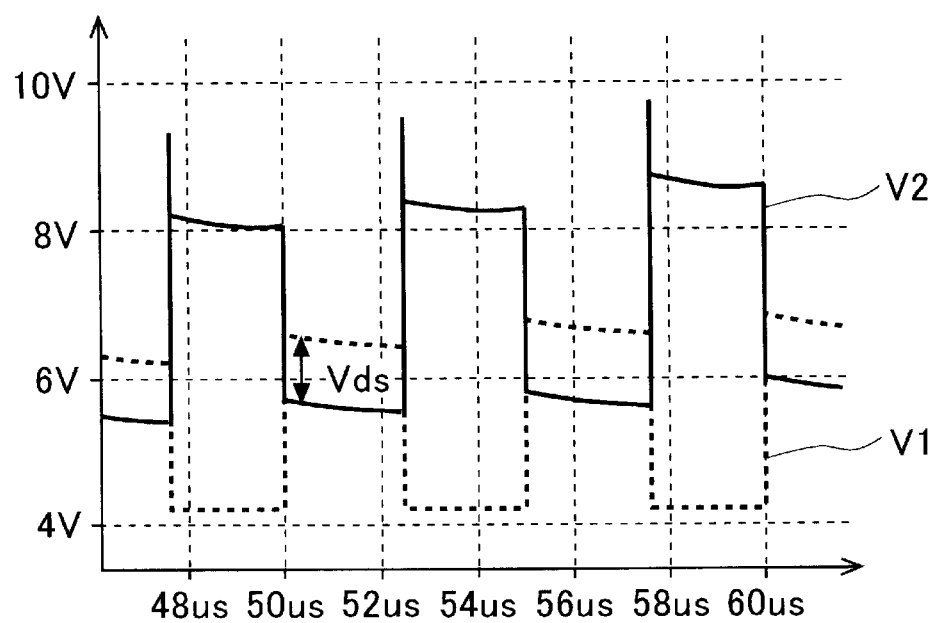
FIG. 3 is a waveform diagram by circuit simulation of the charge pump device according to the embodiment of the invention.

A waveform diagram by circuit simulation of V1 and V2 at operation start of the charge pump device is shown in FIG. 3. Here, V1 is drain voltage of the charge transfer MOS transistor M2, and V2 is drain voltage of the charge transfer MOS transistor M3. Although Vds shows voltage between source and drain in the figure, when it is higher than Vb (about 0.7 V), the NPN transistor Tr1 is made ON so that pseudo latch-up is induced.

Figure 4:
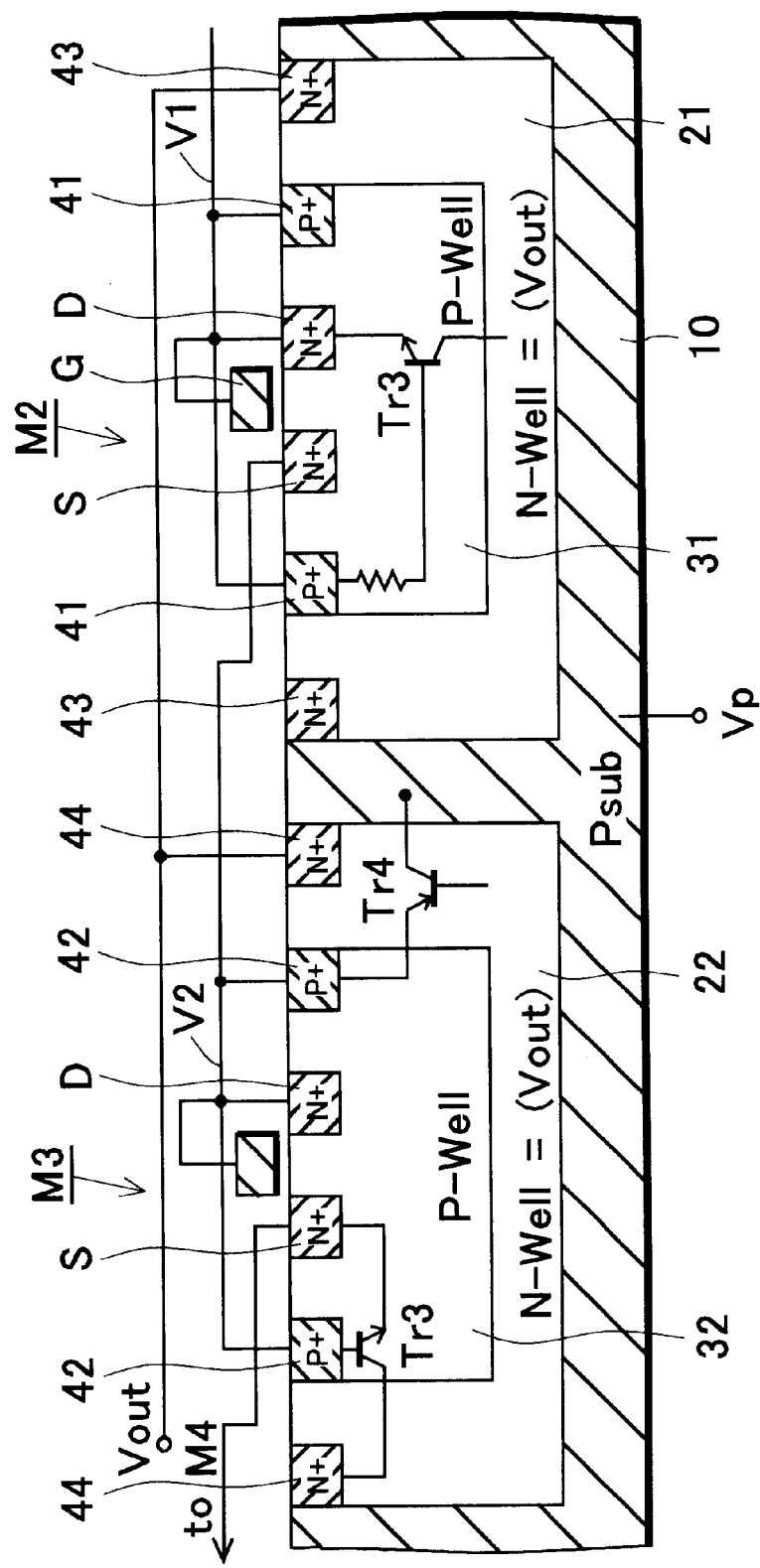
FIG. 4 is a sectional construction view of the charge pump device according to the embodiment of the invention.

Then, a structure of a charge pump device enabling to prevent latch-up generating by the above-mentioned mechanism is shown in FIG. 4. Note that the same or similar components with previous pictures are referenced with the same reference numbers as the previously used numbers, respectively. P type well regions 31 and 32 are respectively formed in N type well regions 21 and 22. The N type well regions 21 and 22 are formed being separated each other. Charge transfer MOS transistors M2 and M3 are formed respectively in the P type well regions 31 and 32. Here, a rule that a P type semiconductor substrate 10 is biased to ground voltage (0 V) or negative voltage is made.

Thus, parasitic NPN transistor Tr3 and parasitic PNP transistor Tr4 shown in FIG. 4 are formed in the region forming the charge transfer MOS transistor M2. Here, emitter of the parasitic NPN transistor Tr3 is drain layer D of the charge transfer MOS transistor M2, base thereof is the P type well region 31, and collector thereof is the separated N type well region 21.

Emitter of the parasitic PNP transistor Tr4 is P+ layer 42 formed in the P type well region 32, base thereof is the separated N type well region 22, and collector thereof is the P type semiconductor substrate 10.

However, the NPN parasitic transistor Tr3 and the parasitic PNP transistor Tr4 are separated electrically. This is because the N type regions 21 and 22 are separated and the P type semiconductor substrate 10 biased reversely between them exists. Therefore, the parasitic thyristor shown in FIG. 2 is not formed and it is considered that the parasitic NPN transistor Tr3 is not turned ON.

According to the experiment carried out actually by the inventor, it is confirmed that latch-up does not appear at the structure of FIG. 4 and the charge pump device carries out normal boosting operation.

N+ layer 43 is formed on the N well region 21 as above-mentioned, and the N well region 21 and the P well region 31 are always biased reversely by supplying output voltage Vout of the charge pump device to the N+ layer 43. Similarly, N+ layer 44 is formed on the N well region 22, and the N well region 22 and the P well region 32 are always biased reversely by supplying output voltage Vout of the charge pump device to the N+ layer 44.

Although an applying example for Dickson charge pump device of four stages in the above-mentioned embodiment, it is obvious that the number of stages is not limited to four stages.

Although the charge transfer MOS transistor is formed by N channel type, even in the case forming with P channel, the invention can be applied similarly by letting polarity of well region and the like inversed. In a charge pump device of negative boosting, connecting relation between the substrate and source at the charge transfer MOS transistor is only reverse, and timing of clock is only reverse.

Further, although gates and drains of the charge transfer transistors M1 to M5 are commonly connected, without limiting to this, the present invention can be effectively applied to a charge pump adopting circuit constitution applying high voltage between gate and source when the charge transfer transistors M1 to M5 are made ON.

According to the invention, since the drain layer of the charge transfer transistor and the well region in which the charge transfer transistor is formed are connected electrically with low resistance, increase of threshold voltage Vth of the charge transfer transistor by back-gate bias effect is surely prevented. Thus, a charge pump device of large output current can be realized.

Further, said well regions in which the charge transfer transistors are formed are separated electrically so that parasitic thyristor structure causing latch-up is not formed. Thus, latch-up is not caused by rush current at operation starting so as to make the charge pump device of large output current operate stably.

What is claimed is:

1. A charge pump device comprising:
   a substrate;
   a plurality of outer well regions provided on and individually separated by the substrate;
   a plurality of inner well regions, each of which is disposed within each of the outer well regions;
   a high concentration diffusion layer of a same conductivity type as the inner well regions, said high concentration diffusion layer disposed within the inner well region;
   a plurality of charge transfer transistors connected in series, each disposed correspondingly in each of said inner well regions;
   a drain layer disposed in each of said charge transfer transistors; and
   a capacitor coupled to a node between adjacent two of said charge transfer transistors,
   wherein each charge transfer transistor is electrically connected to each corresponding inner well region and said high concentration diffusion layer and said drain layer are connected.

2. A charge pump device according to claim 1 wherein said high concentration diffusion layer surround each of said inner well regions.

3. A charge pump device according to claim 1, wherein said outer well regions is separated electrically so that a thyristor causing latch-up is not formed.

4. A charge pump device comprising:
   a first conductivity type substrate;
   a plurality of second conductivity type well regions provided on and individually separated by the first conductivity type substrate;
   a plurality of first conductivity type well regions, each disposed in each of the second conductivity type well regions;

a high concentration diffusion layer of a same conductivity type as the first conductive type well region, said high concentration diffusion layer disposed within the first conductivity type well region;

a plurality of charge transfer transistors connected in series, each disposed correspondingly in each first conductivity type well region;

a drain layer disposed in each of said charge transfer transistors; and a capacitor coupled to a node of adjacent two of said charge transfer transistors, wherein each charge transfer transistor is electrically connected to each corresponding first conductivity type well region and said high concentration diffusion layer and said drain layer are connected.

5. A charge pump device according to claim 4, wherein said high concentration diffusion layer surround said first conductive type well regions.

6. A charge pump device according to claim 4, wherein said first conductive type substrate and said second conductive type well region are reverse biased.

7. A charge pump device according to claim 6, wherein a boosting voltage output from said charge transfer transistor is supplied to said second conductive type well region.

8. A charge pump device comprising:

a substrate;

a plurality of second wells provided on and spaced apart from each other by the substrate;

a plurality of first wells, each disposed within each second well;

a high concentration diffusion layer of a same conductivity type as the first wells, said high concentration diffusion layer disposed within the first wells;

a plurality of charge transfer transistors connected in series, each disposed correspondingly in each of said first wells;

a drain layer disposed in each of said charge transfer transistors; and a capacitor coupled to a node between adjacent two of said charge transfer transistors, wherein each charge transfer transistor is electrically connected to each corresponding first well and said high concentration diffusion layer and said drain layer are connected.

9. A charge pump device according to claim 8, wherein, the high concentration diffusion layer surround each of the first wells, and said diffusion layer having a higher doping concentration than the first well.

10. A charge pump device comprising:

a first conductivity type substrate;

a plurality of second conductivity type wells provided on and spaced apart from each other by the first conductivity type substrate;

a plurality of first conductivity type wells, each disposed within each second conductivity type well;

a high concentration diffusion layer of a same conductivity type as the first conductivity type wells, said high concentration diffusion layer disposed within the first conductivity type wells;

a plurality of charge transfer transistors connected in series, each disposed correspondingly in each of said first conductivity type wells;

a drain layer disposed in each of said charge transfer transistors; and a capacitor coupled to a node between adjacent two of said charge transfer transistors, wherein each charge transfer transistor is electrically connected to each corresponding first conductivity type wells and said high concentration diffusion layer and said drain layer are connected.

11. A charge pump device according to claim 10, wherein, the diffusion layer surrounds each of the first conductivity type wells, and said diffusion layer having a higher doping concentration than the first conductivity type well.

* * * * *